United States Patent
Kang

(10) Patent No.: US 8,896,366 B2
(45) Date of Patent: Nov. 25, 2014

(54) INTERNAL VOLTAGE GENERATION CIRCUIT OF SEMICONDUCTOR DEVICE AND METHOD FOR OPERATING THE SAME

(71) Applicant: SK Hynix Inc., Gyeonggi-do (KR)

(72) Inventor: Hyuk-Choong Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 53 days.

(21) Appl. No.: 13/681,229

(22) Filed: Nov. 19, 2012

(65) Prior Publication Data

US 2014/0035662 A1 Feb. 6, 2014

(30) Foreign Application Priority Data

Jul. 31, 2012 (KR) .................. 10-2012-0083837

(51) Int. Cl.
G05F 1/46 (2006.01)
H02M 3/00 (2006.01)
G05F 5/00 (2006.01)

(52) U.S. Cl.
CPC ........................................ *G05F 5/00* (2013.01)
USPC ............. 327/535; 327/540; 363/59; 323/234

(58) Field of Classification Search
None
See application file for complete search history.

(56) References Cited

U.S. PATENT DOCUMENTS

| 5,671,179 | A | * | 9/1997 | Javanifard | ................ | 365/185.33 |
| 7,724,072 | B2 | * | 5/2010 | Baek et al. | ..................... | 327/536 |
| 7,843,252 | B2 | * | 11/2010 | Schubert | ....................... | 327/536 |

FOREIGN PATENT DOCUMENTS

KR 1020000026469 5/2000

* cited by examiner

*Primary Examiner* — Lincoln Donovan
*Assistant Examiner* — Terry L Englund
(74) *Attorney, Agent, or Firm* — IP & T Group LLP

(57) ABSTRACT

A semiconductor device includes a power supply voltage level/slope detection unit configured to detect a level of a power supply voltage and a slope of a power supply voltage curve, and output a power supply voltage level/slope detection signal, a pumping voltage detection unit configured to detect a level of a pumping voltage based on a reference pumping level to output a pumping detection signal, an oscillation signal generation unit configured to generate an oscillation signal in response to the pumping detection signal and the power supply voltage level/slope detection signal, and a pumping unit configured to generate the pumping voltage by performing a charge pumping operation in response to the oscillation signal.

20 Claims, 7 Drawing Sheets

INTERNAL VOLTAGE GENERATION CIRCUIT OF SEMICONDUCTOR DEVICE AND METHOD FOR OPERATING THE SAME

CROSS-REFERENCE TO RELATED APPLICATIONS

The present application claims priority of Korean Patent Application No. 10-2012-0083837, filed on Jul. 31, 2012, which is incorporated herein by reference in its entirety.

BACKGROUND

1. Field

Exemplary embodiments of the present invention relate to a semiconductor design technology, and more particularly, to an internal voltage generation circuit of a semiconductor device and a method for operating the same.

2. Description of the Related Art

Most semiconductor devices including DRAM use plural internal voltages having a different level, which are generated from external voltages VDD and VSS, in addition to the external voltages. Typically, the semiconductor devices generate the internal voltages through a charge pumping method or voltage down converting method, using a reference voltage corresponding to a target level, an external power supply voltage VDD, and an external ground voltage VSS.

In the case of DRAM, the internal voltages generated by the charge pumping method may include a boost voltage VPP, a back bias voltage VBB, and the like. Furthermore, the internal voltages generated by the voltage down converting method may include a core voltage VCORE, a bit line precharge voltage VBLP, and the like.

The boost voltage VPP has a voltage level greater than the external power supply voltage VDD, and is mainly used for activating word lines.

FIG. 1 is a block diagram illustrating an internal voltage generation circuit of a conventional semiconductor device.

Referring to FIG. 1, the internal voltage generation circuit includes a pumping voltage detection unit 10, an oscillation signal generation unit 20, and a pumping unit 30. The pumping voltage detection unit 10 detects a level of a pumping voltage VPUMP based on a reference pumping level PUMP_VREF to output a pumping detection signal PUMP_DET. The oscillation signal generation unit 20 generates an oscillation signal OSC which oscillates at predetermined frequencies in response to the pumping detection signal PUMP_DET. The pumping unit 30 increases the level of the pumping voltage VPUMP by performing a charge pumping operation when the oscillation signal OSC oscillates.

The pumping voltage detection unit 10 activates the pumping detection signal PUMP_DET when the level of the pumping voltage VPUMP is lower than the reference pumping level PUMP_VREF. On the other hand, the pumping voltage detection unit 10 deactivates the pumping detection signal PUMP_DET when the level of the pumping voltage VPUMP is the same or greater than the reference pumping level PUMP_VREF.

The oscillation signal generation unit 20 generates the oscillation signal OSC, which oscillates at a predetermined first frequency, in response to the activation of the pumping detection signal PUMP_DET. On the other hand, the oscillation signal generation unit 20 generates the oscillation signal OSC, which oscillates at a predetermined second frequency, which is lower than the first frequency, in response to the deactivation of the pumping detection signal PUMP_DET.

The charge pumping operation of the pumping unit 30 is controlled by the oscillation signal OSC. That is, when the oscillation signal OSC oscillates at the first frequency, which is a relatively high frequency, the pumping unit 30 performs a charge pumping operation to generate the pumping voltage VPUMP based on the oscillation signal OSC. On the other hand, when the oscillation signal OSC oscillates at the second frequency, which is a relatively low frequency, the pumping unit 30 infrequently performs or does not perform a charge pumping operation to generate the pumping voltage VPUMP based on the oscillation signal OSC.

FIGS. 2A to 2C illustrates timing diagrams for explaining an operation of the internal voltage generation circuit shown in FIG. 1.

Referring to FIG. 2A, it may be seen that the internal voltage generation circuit of the conventional semiconductor device generates the pumping voltage VPUMP whose level differs depending on a level of the power supply voltage VDD.

Specifically, during a period A where the power supply voltage VDD starts to be supplied to the semiconductor device so that the power supply voltage VDD steadily increases, the level of the power supply voltage VDD may not be sufficiently increased. Therefore, the level of the pumping voltage VPUMP may not be sufficiently increased, either. That is, although not illustrated in the drawing, the level of the pumping voltage VPUMP is lower than the reference pumping level PUMP_VREF. Accordingly, the oscillation signal OSC oscillates at the first frequency, and the level of the pumping voltage VPUMP increases at a relatively high speed through relatively frequent charge pumping operations.

Then, during a period B where the level of the power supply voltage VDD stays the same after a sufficient time elapsed from when the power supply voltage VDD is supplied to the semiconductor device, the operation of the internal voltage generation circuit may significantly differ depending on the level the power supply voltage VDD.

For example, it is assumed that the internal voltage generation circuit generates the pumping voltage VPUMP by pumping the power supply voltage VDD to a three times greater value, and the reference pumping level PUMP_VREF is 3.0V. Referring to FIG. 2B, when the level of the power supply voltage VDD is greater than 1V, that is, the level of the power supply voltage VDD corresponds to 1.0V or 1.1V in FIG. 2A, the level of the pumping voltage VPUMP easily exceeds the reference pumping level PUMP_VREF by the charge pumping operation. Therefore, the oscillation signal OSC oscillates at the second frequency, and the charge pumping operation is performed relatively infrequently. That is, the internal voltage generation circuit operates in a state in which the current consumption caused by the charge pumping operation is minimized.

On the other hand, referring FIG. 2C, when the level of the power supply voltage VDD is lower than 1V, that is, the level of the power supply voltage VDD corresponds to 0.8V or 0.9V in FIG. 2A, the level of the pumping voltage VPUMP is inevitably lower than the reference pumping level PUMP_VREF even though the power supply voltage VDD is continuously pumped. Therefore, the oscillation signal OSC continuously oscillates at the first frequency, and thus, the charge pumping operation is performed relative to the predetermined frequency.

As such, the charge pumping operation may be frequently performed when the level of the power supply voltage VDD is not sufficiently high, even though the level of the pumping voltage VPUMP does not sufficiently increase. In this case, the current may be consumed unnecessarily.

SUMMARY

Exemplary embodiment of the present invention is directed to an internal voltage generation circuit capable of minimizing current consumption even in a low-power environment where the level of a power supply voltage is low.

In accordance with an embodiment of the present invention, a semiconductor device includes a power supply voltage level/slope detection unit configured to detect a level of a power supply voltage and a slope of a power supply voltage curve, and output a power supply voltage level/slope detection signal, a pumping voltage detection unit configured to detect a level of a pumping voltage based on a reference pumping level to output a pumping detection signal, an oscillation signal generation unit configured to generate an oscillation signal in response to the pumping detection signal and the power supply voltage level/slope detection signal, and a pumping unit configured to generate the pumping voltage by performing a charge pumping operation in response to the oscillation signal.

In accordance with another embodiment of the present invention, a semiconductor device includes a power supply voltage detection unit configured to detect a level of a power supply voltage based on a reference power supply level to output a power supply voltage detection signal, a slope detection unit configured to detect a slope of a power supply voltage curve to output a slope sensing signal, a pumping voltage detection unit configured to detect a level of a pumping voltage based on a reference pumping level to output a pumping detection signal, an oscillation control signal generation unit configured to output an oscillation control signal in response to the pumping detection signal, and fix a level of the oscillation control signal to a given value in response to the power supply voltage detection signal and the slope sensing signal, an oscillation signal generation unit configured to generate an oscillation signal in response to the pumping detection signal and the power supply voltage level/slope detection signal, and a pumping unit configured to generate the pumping voltage by performing a charge pumping operation in response to the oscillation signal.

In accordance with another embodiment of the present invention, a method for operating a semiconductor device includes performing a charge pumping operation on a pumping voltage at each given first frequency when a power supply voltage has a level greater than a reference power supply level and the pumping voltage has a level lower than a reference pumping level, performing a charge pumping operation on the pumping voltage at each of the first frequency in response to a slope of the power supply voltage curve having a positive characteristic, when the power supply voltage has a level lower than the reference power supply level and the pumping voltage has a level lower than the reference pumping level, and performing a charge pumping operation on the pumping voltage at each given second frequency in response to the level variation slope of the power supply voltage having zero or a negative characteristic, when the power supply voltage has a level lower than the reference power supply level and the pumping voltage has a level lower than the reference pumping level, wherein the second frequency has a frequency lower than the first frequency.

DETAILED DESCRIPTION

Figure 1:
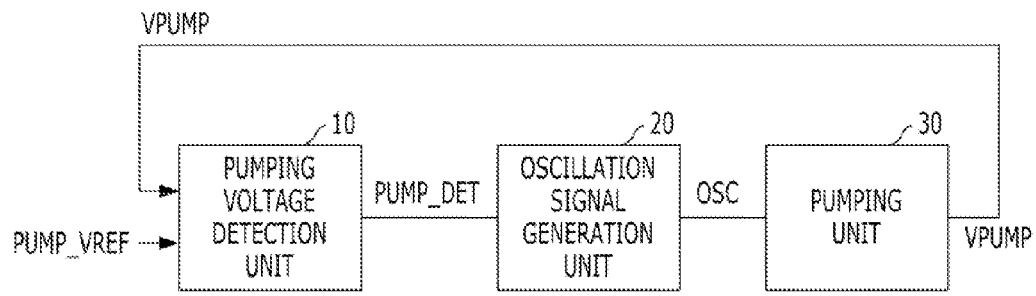
FIG. 1 is a block diagram illustrating an internal voltage generation circuit of a conventional semiconductor device.
Figure 2A:
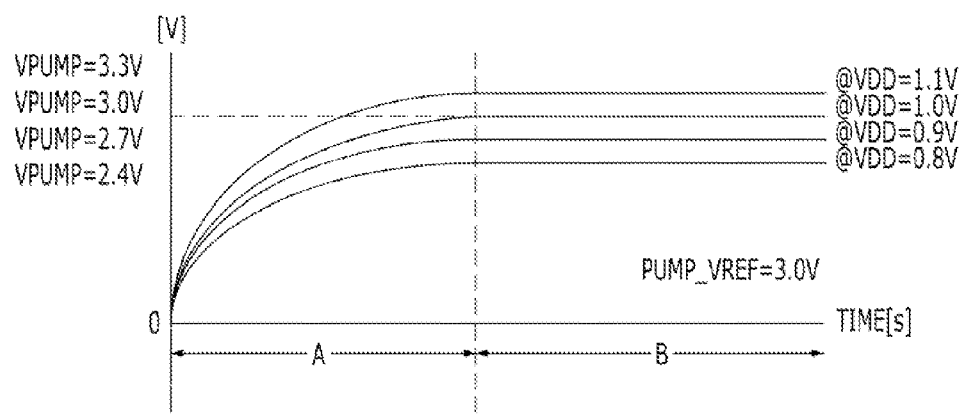
FIGS. 2A to 2C are timing diagrams illustrating the operation of the internal voltage generation circuit shown in FIG. 1.
Figure 2B:
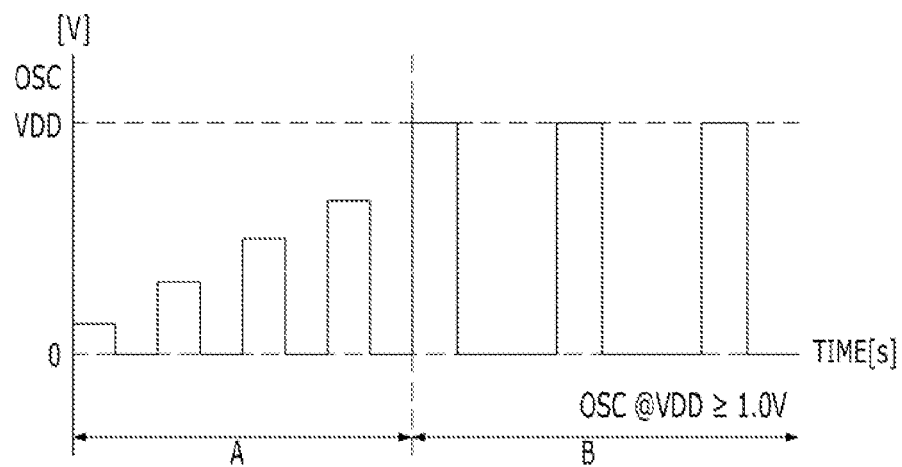
Figure 2C:
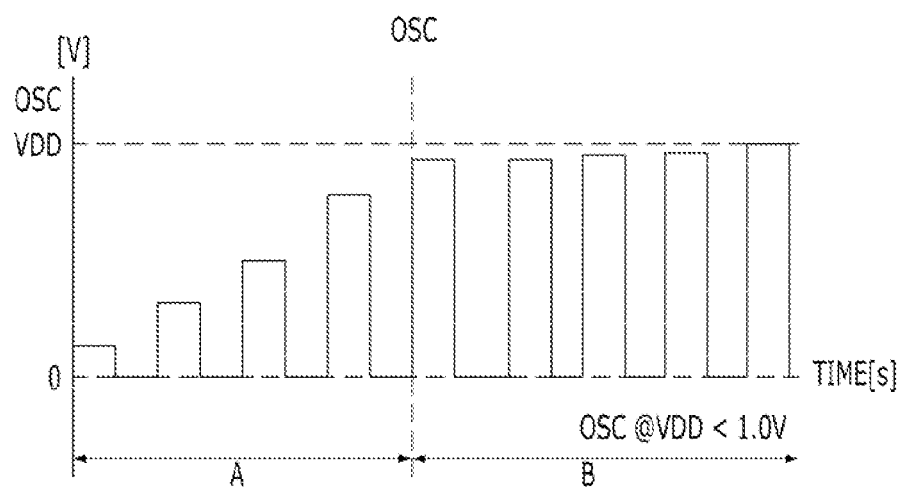

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
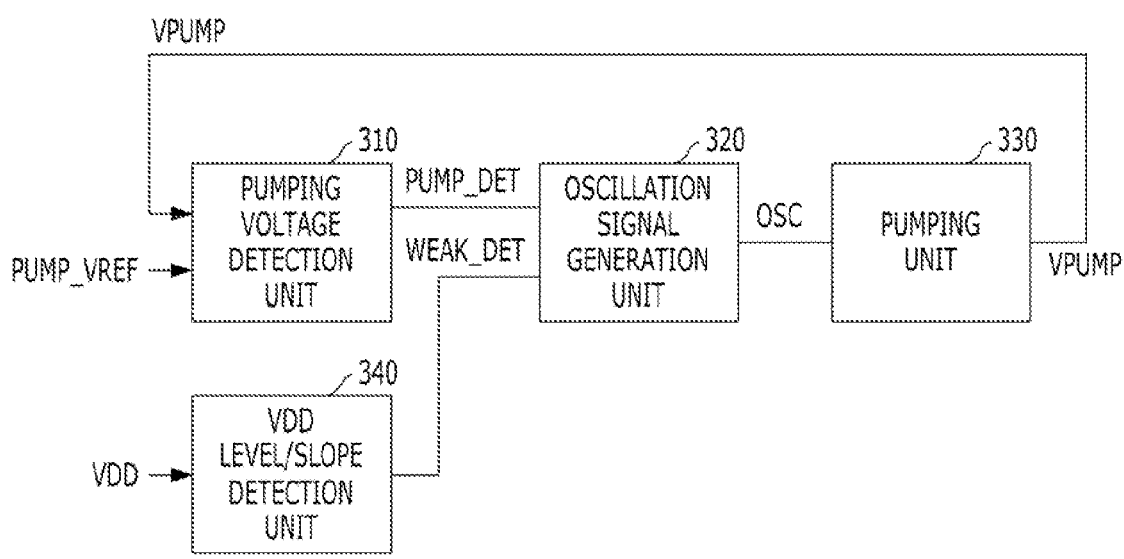
FIG. 3 is a block diagram illustrating an internal voltage generation circuit of a semiconductor device in accordance with an embodiment of the present invention.

FIG. 3 is a block diagram of an internal voltage generation circuit of a semiconductor device in accordance with an embodiment of the present invention.

Referring to FIG. 3, the internal voltage generation circuit includes a pumping voltage detection unit 310, an oscillation signal generation unit 320, a pumping unit 330, and a power supply voltage (VDD) level/slope detection unit 340.

The pumping voltage detection unit 310 is configured to detect a level of a pumping voltage VPUMP based on a reference pumping level PUMP_VREF to output a pumping detection signal PUMP_DET. The oscillation signal generation unit 320 is configured to generate an oscillation signal OSC in response to the pumping detection signal PUMP_DET and a VDD level/slope detection signal WEAK_DET. The pumping unit 330 is configured to generate the pumping voltage VPUMP by performing a charge pumping operation in response to the oscillation signal OSC. The power supply voltage level/slope detection unit 340 is configured to detect a level of VDD and a slope of a VDD curve, and output the VDD level/slope detection signal WEAK_DET.

The oscillation signal OSC oscillates at a first frequency during an activation period of the pumping detection signal PUMP_DET and the VDD level/slope detection signal WEAK_DET while oscillating at a second frequency having a frequency lower than the first frequency during any deactivation period of the pumping detection signal and the VDD level/slope detection signal WEAK_DET.

The frequency of the oscillation signal OSC varies based on the detection result of the level of VDD and the slope of a VDD curve in addition to the pumping detection signal PUMP_DET. The frequency of the oscillation signal OSC may be lowered by detecting a weak condition of VDD. Thus, the current consumption caused by the charge pumping operation may be minimized.

Figure 4:
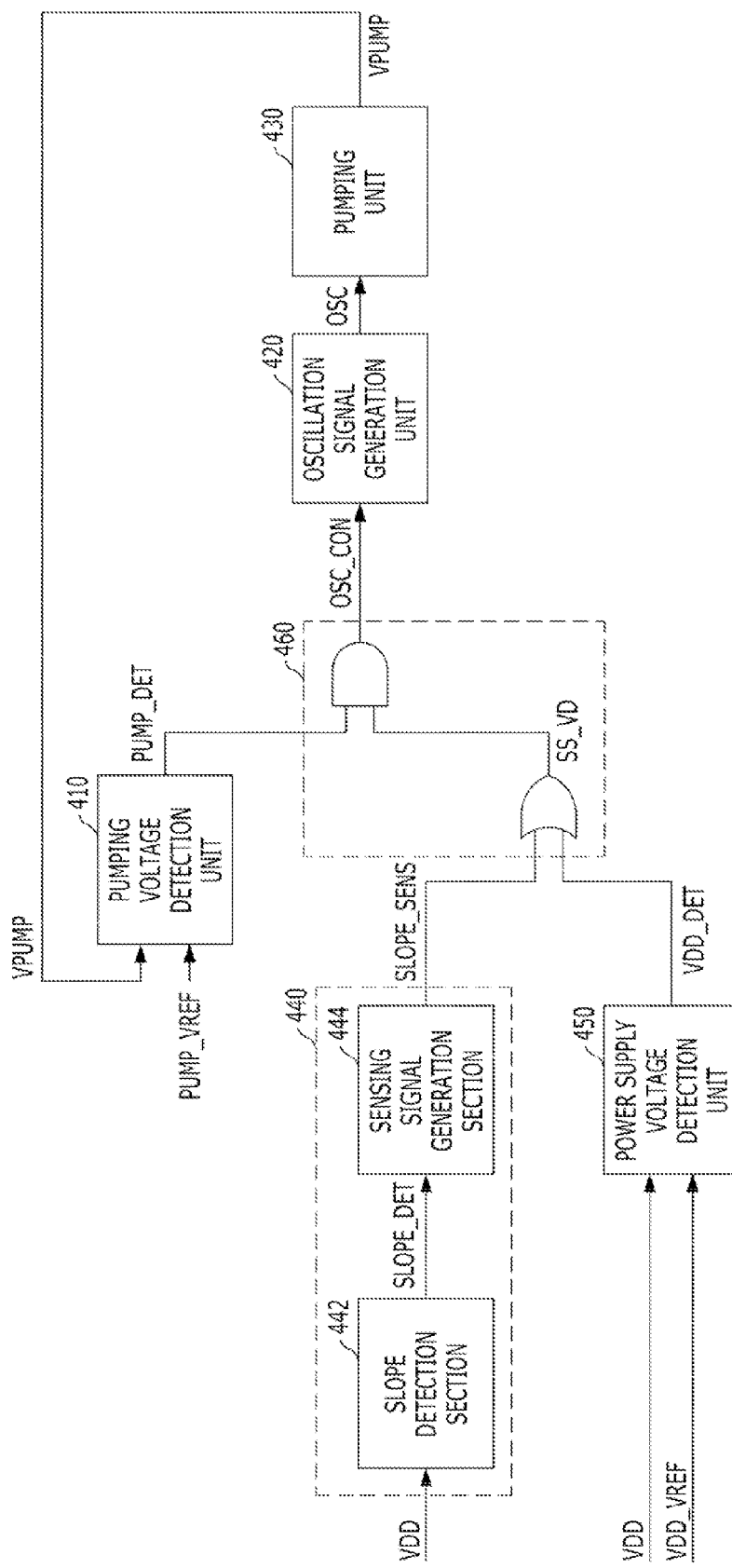
FIG. 4 is a block diagram illustrating an internal voltage generation circuit of a semiconductor device in accordance with another embodiment of the present invention.

FIG. 4 is a block diagram of an internal voltage generation circuit of a semiconductor device in accordance with another embodiment of the present invention.

Referring to FIG. 4, the internal voltage generation circuit includes a pumping voltage detection unit 410, an oscillation signal generation unit 420, a pumping unit 430, a slope detection unit 440, a power supply voltage detection unit 450, and an oscillation control signal generation unit 460.

The pumping voltage detection unit 410 is configured to detect a level of a pumping voltage VPUMP based on a reference pumping level PUMP_VREF to output a pumping detection signal PUMP_DET. The slope detection unit 440 is configured to detect a slope of a power supply voltage (VDD) curve to output a slope sensing signal SLOPE_SENSE. The power supply voltage detection unit 450 is configured to detect a level of the power supply voltage VDD based on a reference power supply level VDD_VREF to output a power supply voltage detection signal VDD_DET. The oscillation control signal generation unit 460 is configured to output an oscillation control signal OSC_CON in response to the pumping detection signal PUMP_DET, and fix a level of the oscillation control signal OSC_CON to a given value in response to the power supply voltage detection signal VDD_DET and the slope sensing signal SLOPE_SENS. The oscillation signal generation unit 420 configured to generate the oscillation signal OSC in response to the oscillation control signal OSC_CON. The pumping unit 430 is configured to generate the pumping voltage VPUMP by performing a charge pumping operation in response to the oscillation signal OSC.

Further, the slope detection unit 440 includes a slope detection section 442 and a sensing signal generation section 444. The slope detection section 442 is configured to generate a slope detection signal SLOPE_DET whose voltage level varies based on the slope of the VDD curve (ΔV). The sensing signal generation section 444 is configured to determine the voltage level of the slope detection signal SLOPE_DET based on a reference logic level LOGIC_LV (not illustrated), and generate a slope sensing signal SLOPE_SENSE whose logic level is decided based on the determination result.

The slope detection section 442 generates the slope detection signal SLOPE_DET having a voltage level greater than the reference logic level LOGIC_LV when the slope of the VDD curve ΔV has a positive characteristic, and generates the slope detection signal SLOPE_DET having a voltage level lower than the reference logic level LOGIC_LV when the slope of the VDD curve ΔV is zero or has a negative characteristic.

When the slope of the VDD curve ΔV has a positive characteristic, it means that the absolute level of the power supply voltage VDD increases with the time. That is, during a period where the power supply voltage VDD starts to be supplied so that the level of the power supply voltage VDD increases, the slope of the VDD curve ΔV has a positive characteristic. Furthermore, when the slope of the VDD curve ΔV is zero, it means that the level of the power supply voltage VDD does not vary, and maintains the value. That is, in such a state where the power supply voltage VDD is supplied for a sufficient time such that the level of the power supply voltage VDD is stabilized, the power supply voltage VDD has no slope ΔV. Furthermore, when the slope of the VDD curve ΔV has a negative characteristic, it means that the absolute level of the power supply voltage VDD decreases with the time. That is, during a period where the supply of the power supply voltage VDD is ended so that the level of the power supply voltage VDD decreases, the slope of the VDD curve ΔV has a negative characteristic.

The sensing signal generation section 444 activates the slope sensing signal SLOPE_SENS when the slope detection signal SLOPE_DET has a voltage level greater than the reference logic level LOGIC_LV, and deactivates the slope sensing signal SLOPE_SENS when the slope detection signal SLOPE_DET has a voltage level lower than the reference logic level LOGIC_LV.

Here, the reference logic level LOGIC_LV may indicate a level corresponding to a middle level between the power supply voltage VDD and a ground voltage VSS. In this embodiment of the present invention, however, the reference logic level LOGIC_LV may indicate a level obtained by dividing the voltage level range of the slope detection signal SLOPE_DET, and may have a given range. For example, when the voltage level of the slope detection signal SLOPE_DET is set in the range of 1.0V to −1.0V, the reference logic level LOGIC_LV may be set in the range of 0.1V to −0.1V based on 0V. However, when the voltage level of the slope detection signal SLOPE_DET is set in the range of 1.0V to 0V, the reference logic level LOGIC_LV may be set in the range of 0.6V to 0.4V based on 0.5V.

At this time, since the slope detection signal SLOPE_DET has an analog voltage level, the voltage level of the slope detection signal SLOPE_DET may belong to the voltage level range of the reference logic level LOGIC_LV. In this case, the slope sensing signal SLOPE_SENS may be set to a predetermined logic level by a designer.

For example, suppose that the voltage level of the slope detection signal SLOPE_DET is set in the range of 1.0V to 0V, and the reference logic level LOGIC_LV is set in the range of 0.4V to 0.6V. When the slope detection signal SLOPE_DET has a voltage level equal to or less than 1.0V and greater than 0.6V depending on a designer's selection, the slope sensing signal SLOPE_SENS may be generated at a high level, and when the slope detection signal SLOPE_DET has a voltage level equal to or less than 0.6V and equal to or greater than 0V, the slope sensing signal SLOPE_SENS may be generated at a low level. Similarly, when the slope detection signal SLOPE_DET has a voltage level equal to or less than 1.0V and equal to or greater than 0.4V depending on a designer's selection, the slope sensing signal SLOPE_SENS may be generated at a high level, and when the slope detection signal SLOPE_DET has a voltage level less than 0.4V and equal to or greater than 0V, the slope sensing signal SLOPE_SENS may be generated at a logic low.

However, the voltage level of the slope detection signal SLOPE_DET may be set in the range of 1.0V to −1.0V and the reference logic level LOGIC_LV may be set in the range of 0.1V to −0.1V. In this case, when the slope detection signal SLOPE_DET has a voltage level equal to or less than 1.0V and greater than 0.1V depending on a designer's selection, the slope sensing signal SLOPE_SENS may be generated at a high level, and when the slope detection signal SLOPE_DET has a voltage level equal to or less than 0.1V and equal to or greater than −1.0V, the slope sensing signal SLOPE_SENS may be generated at a low level. Similarly, when the slope detection signal SLOPE_DET has a voltage level equal to or less than 1.0V and equal to or more than −0.1V depending on a designer's selection, the slope sensing signal SLOPE_SENS may be generated at a high level, and when the slope detection signal SLOPE_DET has a voltage level less than −0.1V and equal to or greater than −1.0V, the slope sensing signal SLOPE_SENS may be generated at a low level.

Furthermore, since the pumping voltage VPUMP is generated by pumping the power supply voltage VDD, the reference pumping level PUMP_VREF becomes N times greater than the reference power supply level VDD_VREF where N is an integer greater than two. In this exemplary embodiment of the present invention, it has been described that the reference pumping level PUMP_VREF has a voltage level three times greater than the reference power supply level VDD_VREF. However, this configuration may differ based on a designer's selection.

The power supply voltage detection unit 450 is configured to activate and output a power supply voltage detection signal VDD_DET when the level of the power supply voltage VDD is greater than the reference power supply level VDD_VREF, and deactivate and output the power supply voltage detection signal VDD_DET when the level of the power supply voltage VDD is lower than the reference power supply level VDD_VREF.

The pumping voltage detection unit 410 is configured to deactivate the pumping detection signal PUMP_DET when the pumping voltage VPUMP is greater than the reference pumping level PUMP_VREF, and activate the pumping detection signal PUMP_DET when the pumping voltage VPUMP is lower than the reference pumping level PUMP_VREF.

The oscillation control signal generation unit 460 is configured to output the oscillation control signal OSC_CON when at least one of the power supply voltage detection signal VDD_DET and the slope sensing signal SLOPE_SENS is activated. The oscillation control signal unit 460 is configured to deactivate the oscillation control signal OSC_CON regardless of whether the pumping detection signal PUMP_DET is activated or not, when both of the power supply voltage detection signal VDD_DET and the slope sensing signal SLOPE_SENS are deactivated.

The oscillation signal generation unit 420 is configured to generate an oscillation signal OSC, which oscillates at a predetermined first frequency having a relatively high frequency during an activation period of the oscillation control signal OSC_CON and oscillates at a predetermined second frequency having a relatively low frequency during a deactivation period of the oscillation control signal OSC_CON. The pumping unit 430 is configured to increase the level of the pumping voltage VPUMP by performing a charge pumping operation whenever the oscillation signal OSC oscillates.

At this time, the second frequency has a frequency, which is lower than the first frequency, and may have a frequency of zero depending on a designer's selection. That is, the operation where the oscillation signal OSC oscillates at the second frequency may include an operation where the oscillation signal OSC does not oscillate.

For reference, though it is not illustrated in FIG. 3, the power supply voltage level/slope detection unit 340 of FIG. 3 may comprise a power supply voltage detection unit (corresponding to "450" shown in FIG. 4) and a slope detection unit (corresponding to "440" shown in FIG. 4). The power supply voltage detection unit is configured to detect the level of VDD based on a reference power supply level VDD_VREF to output a power supply voltage detection signal VDD_DET. The slope detection unit is configured to detect the slope of the VDD curve to output a slope sensing signal SLOPE_SENSE. The power supply voltage level/slope detection unit 340 may further comprise a first combination unit configured to output the power supply voltage detection signal outputted from the power supply voltage detection unit, or the slope sensing signal outputted from the slope detection unit.

Though it is not illustrated in FIG. 3, the oscillation signal generation unit 320 of FIG. 3 may comprise a second combination unit and an oscillation signal output unit (corresponding to "420" shown in FIG. 4). The second combination unit is configured to an oscillation control signal OSC_CON in response to the pumping detection signal PUMP_DET, and fixes a level of the oscillation control signal OSC_CON to a given value in response to the power supply voltage level/slope detection signal WEAK_DET. The oscillation signal output unit is configured to generate the oscillation signal OSC in response to the oscillation control signal OSC_CON.

For reference, the first and second combination units are corresponding to logic gates included in the oscillation control signal generation unit 460 shown in FIG. 4, respectively.

FIGS. 5A to 5E are timing diagrams for illustrating the operations of the power supply voltage detection unit 450, the slope detection unit 440, and the oscillation control signal generation unit 460 shown in FIG. 4.

Figure 5A:
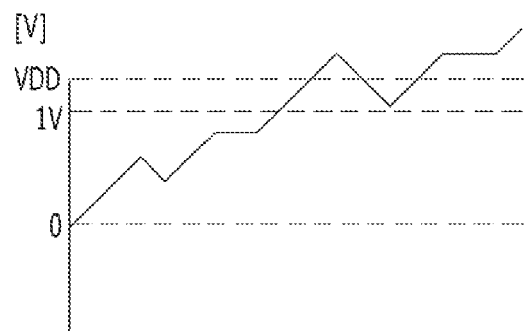
FIGS. 5A to 5E are timing diagrams illustrating operations of a power supply voltage detection unit, a slope detection unit, and an oscillation control signal generation unit shown in FIG. 4.
Figure 5B:
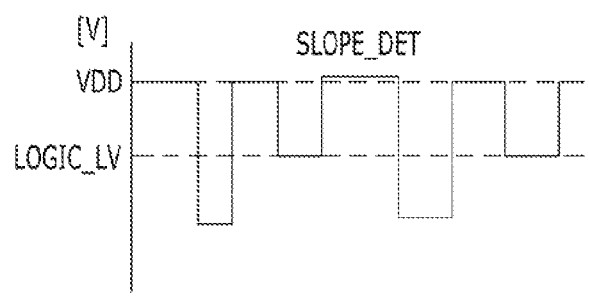
Figure 5C:
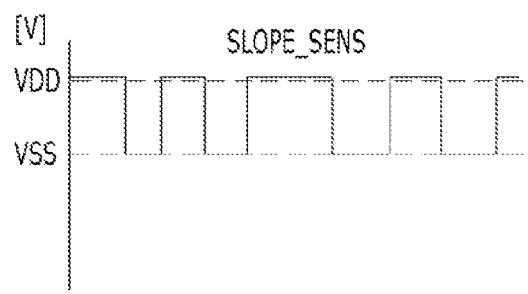

First, referring to FIGS. 5A and 5B, the slope detection section 442 of the slope detection unit 440 generates the slope detection signal SLOPE_DET whose voltage level varies based on the slope of the VDD curve ΔV. Here, it is assumed that the level of the power supply voltage VDD is set to 1.5V. Referring to FIG. 5C, the sensing signal generation section 444 of the slope detection unit 440 generates the slope sensing signal SLOPE_SENSE according to the voltage level of the slope detection signal SLOPE_DET based on the reference logic level LOGIC_LV.

Figure 5D:
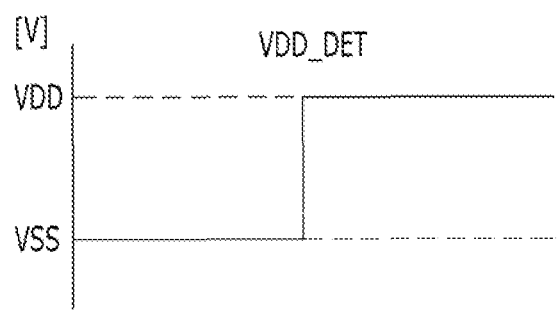

Next, referring to FIG. 5D, the power supply voltage detection unit 450 outputs the power supply voltage detection signal VDD_DET by detecting the level of the power supply voltage VDD based on the reference power supply level VDD_VREF.

Figure 5E:
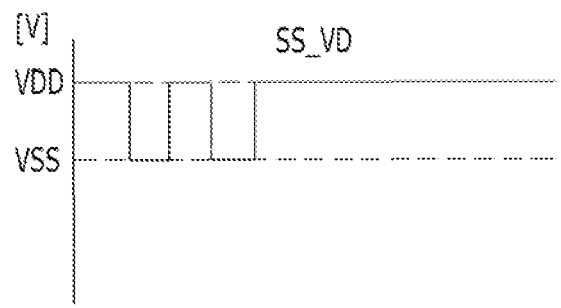

Finally, the oscillation control signal generation unit 460 performs an OR operation on the slope sensing signal SLOPE_SENS shown in FIG. 5C and the power supply voltage detection signal VDD_DET shown in FIG. 5D to output a combination signal SS_VD shown in FIG. 5E based on the OR operation result. Furthermore, the oscillation control signal generation unit 460 performs an AND operation on the combination signal SS_VD and the pumping detection signal PUMP_DET to output the oscillation control signal OSC_CON based on the AND operation result.

Specifically, in a state where the slope of the VDD curve ΔV has a positive characteristic, the oscillation control signal generation unit 460 outputs the pumping detection signal PUMP_DET as the oscillation control signal OSC_CON regardless of whether the level of the power supply voltage VDD has a level greater or lower than the reference power supply level VDD_VREF.

That is, during a period where the slope sensing signal SLOPE_SENS is activated to a high level in response to when the slope of the VDD curve ΔV has a positive characteristic, the combination signal SS_VD is activated at a high level, regardless of whether the period overlaps a period where the level of the power supply voltage VDD has a voltage level lower than the reference power supply level VDD_VREF such that the power supply voltage detection signal VDD_DET is deactivated to a low level or a period where the level of the power supply voltage VDD has a voltage level greater than the reference power supply level VDD_VREF such that the power supply voltage detection signal VDD_DET is activated to a high level.

Similarly, in a state where the level of the power supply voltage VDD is greater than the reference power supply level VDD_VREF, the oscillation control signal generation unit 460 outputs the pumping detection signal PUMP_DET as the oscillation control signal OSC_CON regardless of the characteristic of the slope of the VDD curve ΔV.

That is, during a period where the level of the power supply voltage VDD becomes greater than the reference power supply level VDD_VREF such that the power supply voltage detection signal VDD_DET is detected at a high level, the combination signal SS_VD is activated to a high level, regardless of whether the period overlaps a period where the slope of the VDD curve ΔV is zero or has a negative characteristic such that the slope sensing signal SLOPE_SENS is deactivated to a low level or a period where the slope of the VDD curve ΔV has a positive characteristic such that the slope sensing signal SLOPE_SENS is activated to a high level.

On the other hand, when the level of the power supply voltage VDD is lower than the reference power supply level VDD_VREF in a state where the slope of the VDD curve ΔV is zero or has a negative characteristic, the oscillation control signal generation unit 460 deactivates and outputs the oscillation control signal OSC_CON regardless of whether the pumping detection signal PUMP_DET is activated or not.

That is, when the slope of the VDD curve ΔV is zero or has a negative characteristic such that the period where the slope sensing signal SLOPE_SENS is deactivated to a low level overlaps the period where the level of the power supply voltage VDD is lower than the reference power supply level VDD_VREF, the combination signal SS_VD is deactivated to a low level.

The combination signal SS_VD and the pumping detection signal PUMP_DET, of which the activation/deactivation periods are set as described above, may be outputted as the oscillation control signal OSC_CON through an OR operation, and whether or not to activate the pumping detection signal PUMP_DET may be decided in various manners according to the operation of the semiconductor device. Therefore, during the period where the combination signal SS_VD is activated, whether or not to activate the oscillation control signal OSC_CON follows whether or not to activate the pumping detection signal PUMP_DET. For example, during the period where the combination signal SS_VD is deactivated, the oscillation control signal OSC_CON is deactivated regardless of whether the pumping detection signal PUMP_DET is activated or not.

Specifically, when the level of the power supply voltage VDD is lower than the reference power supply level VDD_VREF, the level of the pumping voltage VPUMP is lower than the reference pumping level PUMP_VREF. Therefore, the pumping detection signal PUMP_DET is activated. At this time, during the period where the slope sensing signal SLOPE_SENS and the combination signal SS_VD are activated in a state where the slope of the VDD curve ΔV has a positive characteristic, the oscillation control signal OSC_CON are activated together with the activated pumping detection signal PUMP_DET. However, during the period where the slope sensing signal SLOPE_SENS and the combination signal SS_VD are deactivated in a state where the slope of the VDD curve ΔV is zero or has a negative characteristic, the oscillation control signal OSC_CON is deactivated regardless of the activated pumping detection signal PUMP_DET.

Although the level of the power supply voltage VDD is greater than the reference power supply level VDD_VREF, the level of the pumping voltage VPUMP will also be greater than the reference pumping level PUMP_VREF. Therefore, whether or not to activate the pumping detection signal PUMP_DET is decided according to the operation of the semiconductor device. At this time, the state in which the level of the power supply voltage VDD is greater than the reference power supply level VDD_VREF corresponds to a period where the power supply voltage detection signal VDD_DET and the combination signal SS_VD are activated together. Therefore, the pumping detection signal PUMP_DET and the oscillation control signal OSC_CON are activated or deactivated together according to the operation of the semiconductor device.

Figure 6A:
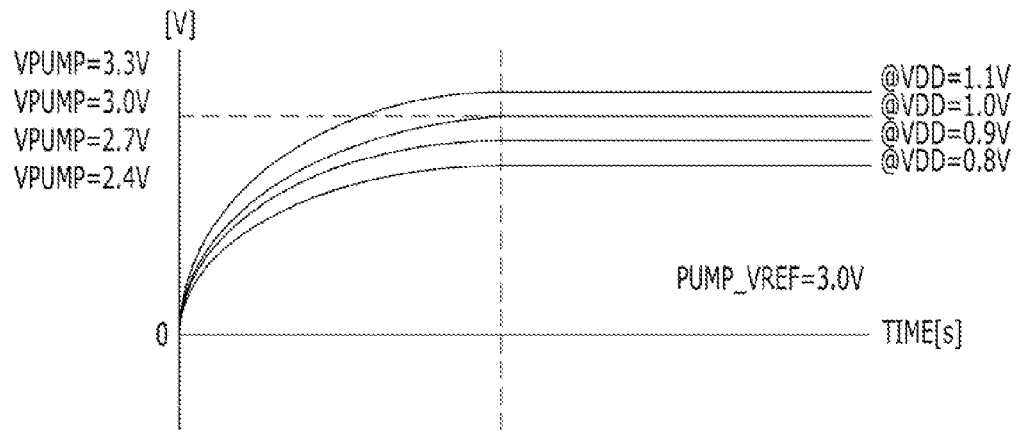
FIGS. 6A to 6C are timing diagrams illustrating an operation of the internal voltage generation circuit shown in FIG. 4.
Figure 6B:
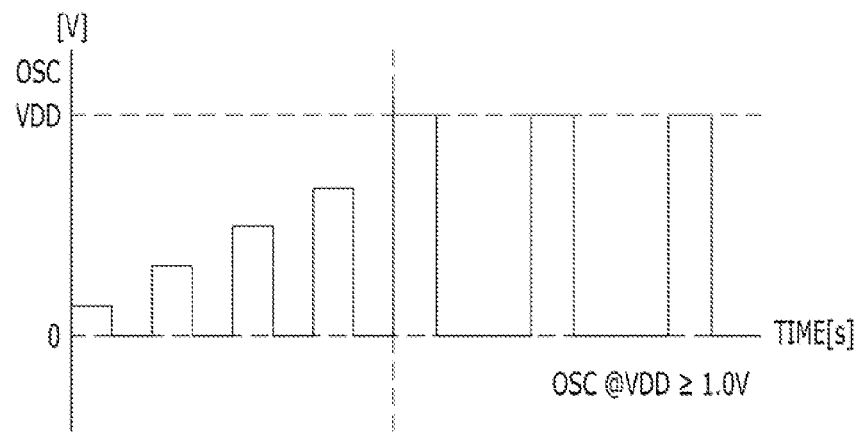
Figure 6C:
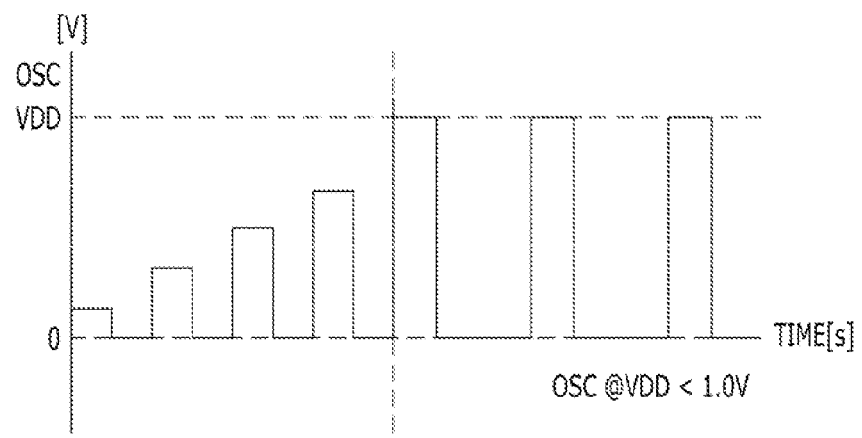

FIGS. 6A to 6C are timing diagrams for illustrating an operation of the internal voltage generation circuit shown in FIG. 4.

Referring to FIG. 6A, it may be seen that the operation of the internal voltage generation circuit of the semiconductor device in accordance with the embodiment of the present invention differs depending on the level of the power supply voltage VDD and the slope of the VDD curve ΔV.

Specifically, during the period where the power supply voltage VDD starts to be supplied to the semiconductor device and the level of the power supply voltage VDD steadily increases, the level of the pumping voltage VPUMP does not sufficiently increase, because the level of the power supply voltage VDD does not yet sufficiently increase. That is, the level of the power supply voltage VDD is lower than the reference power reference voltage VDD_VREF, the slope of the VDD curve ΔV has a positive characteristic, and the level of the pumping voltage VPUMP is lower than the reference pumping level PUMP_VREF, as illustrated in the drawing. Therefore, the oscillation control signal OSC_CON is activated, and thus the oscillation signal OSC oscillates at the first frequency having a relatively high frequency. Accordingly, the level of the pumping voltage VPUMP increases at a relatively high speed through relatively frequent charge pumping operations.

Then, during the period where the level of the power supply voltage VDD is stabilized with a sufficient time after the power supply voltage VDD is supplied to the semiconductor device, the operation of the internal voltage generation circuit is performed in a regular manner regardless of whether the voltage level is greater or lower than the reference power supply level VDD_VREF.

Specifically, it is assumed that the internal voltage generation circuit generates the pumping voltage VPUMP by pumping the power supply voltage VDD to a three times greater value, and the reference pumping level PUMP_VREF is 3.0V. When the reference power supply level VDD_VREF is 1V and the level of the power supply voltage VDD is equal to or greater than 1V corresponding to the reference power supply level VDD_VREF, that is, the level of the power supply voltage VDD corresponds to 1.0V or 1.1V in FIG. 6B, the level of the pumping voltage VPUMP easily exceeds the reference pumping level PUMP_VREF the moment the power supply voltage VDD is pumped to a three times large value. Therefore, the oscillation signal OSC oscillates at the second frequency having a relatively low frequency regardless of whether the slope of the VDD curve ΔV is zero or not. Accordingly, the charge pumping operation is performed relatively infrequently. That is, the current consumption caused by the charge pumping operation may be minimized.

Furthermore, when the level of the power supply voltage VDD is lower than 1V corresponding to the reference power supply level VDD_VREF, that is, the level of the power supply voltage VDD corresponds to 0.8V and 0.9V in FIG. 6C, the level of the pumping voltage VPUMP is inevitably lower than the reference pumping level PUMP_VREF even though the power supply voltage VDD is pumped to a three times greater value. However, since the slope of the VDD curve ΔV is zero, the oscillation signal OSC oscillates at the second frequency having a relatively low frequency, and thus, the charge pumping operation is relatively infrequently performed. That is, the current consumption caused by the charge pumping operation may be minimized.

As described above, in a state where the level of the power supply voltage VDD is sufficiently high, the operation of generating the pumping voltage VPUMP may be normally performed regardless of the level variation of the power supply voltage VDD. However, in a state where the level of the power supply voltage VDD is not sufficiently high so that the level of the pumping voltage VPUMP does not sufficiently increases, the pumping operation is controlled according to the slope of the VDD curve ΔV. Therefore, it is possible to prevent unnecessary current consumption.

In accordance with the embodiment of the present invention, the operation of the internal voltage generation circuit is controlled according to the result obtained by detecting the level of the power supply voltage VDD and the result obtained by sensing the slope of the power supply voltage curve, which makes it possible to prevent unnecessary current consumption even in a low power environment in which the level of the power supply voltage VDD is low.

While the present invention has been described with respect to the specific embodiments, it will be apparent to those skilled in the art that various changes and modifications may be made without departing from the spirit and scope of the invention as defined in the following claims.

For example, the positions and types of the logic gates and transistors in the above-described embodiment of the present invention may be differently set depending on the polarities of inputsignals.

What is claimed is:

1. A semiconductor device comprising:
a power supply voltage level/slope detection unit configured to detect a level of a power supply voltage and a slope of a power supply voltage curve, and output a power supply voltage level/slope detection signal;
a pumping voltage detection unit configured to detect a level of a pumping voltage based on a reference pumping level to output a pumping detection signal;
an oscillation signal generation unit configured to generate an oscillation signal in response to the pumping detection signal and the power supply voltage level/slope detection signal; and
a pumping unit configured to generate the pumping voltage by performing a charge pumping operation in response to the oscillation signal.

2. The semiconductor device of claim 1, wherein the oscillation signal oscillates at a first frequency during an activation period of the pumping detection signal and the power supply voltage level/slope detection signal while oscillating at a second frequency having a frequency lower than the first frequency during any deactivation period of the pumping detection signal and the power supply voltage level/slope detection signal.

3. The semiconductor device of claim 1, wherein the power supply voltage level/slope detection unit comprises:
a power supply voltage detection unit configured to detect the level of the power supply voltage based on a reference power supply level to output a power supply voltage detection signal; and
a slope detection unit configured to detect the slope of the power supply voltage curve to output a slope sensing signal.

4. The semiconductor device of claim 3, wherein the power supply voltage level/slope detection unit further comprises:
a first combination unit configured to output the power supply voltage detection signal, which is outputted from the power supply voltage detection unit, or the slope sensing signal, which is outputted from the slope detection unit, as the power supply voltage level/slope detection signal.

5. The semiconductor device of claim 3, wherein the slope detection unit comprises:
a slope detection section configured to generate a slope detection signal whose voltage level varies according to the slope of the power supply voltage curve; and
a sensing signal generation section configured to determine a voltage level of the slope detection signal based on a reference logic level, and generate the slope sensing signal whose logic level is decided according to the determination result.

6. The semiconductor device of claim 4, wherein the oscillation signal generation unit comprises:
a second combination unit configured to output an oscillation control signal in response to the pumping detection signal, and fix a level of the oscillation control signal to a given value in response to the power supply voltage level/slope detection signal; and
an oscillation signal output unit configured to generate the oscillation signal in response to the oscillation control signal.

7. A semiconductor device comprising:
a power supply voltage detection unit configured to detect a level of a power supply voltage based on a reference power supply level to output a power supply voltage detection signal;
a slope detection unit configured to detect a slope of a power supply voltage curve to output a slope sensing signal;
a pumping voltage detection unit configured to detect a level of a pumping voltage based on a reference pumping level to output a pumping detection signal;
an oscillation control signal generation unit configured to output an oscillation control signal in response to the pumping detection signal, and fix a level of the oscillation control signal to a given value in response to the power supply voltage detection signal and the slope sensing signal;
an oscillation signal generation unit configured to generate an oscillation signal in response to the oscillation control signal; and
a pumping unit configured to generate the pumping voltage by performing a charge pumping operation in response to the oscillation signal.

8. The semiconductor device of claim 7, wherein the slope detection unit comprises:
a slope detection section configured to generate a slope detection signal whose voltage level varies according to the slope of the power supply voltage curve; and
a sensing signal generation section configured to determine a voltage level of the slope detection signal based on a reference logic level, and generate the slope sensing signal whose logic level is decided according to the determination result.

9. The semiconductor device of claim 8, wherein the slope detection section generates the slope detection signal having a voltage level greater than the reference logic level when the slope of the power supply voltage curve has a positive characteristic, and generates the slope detection signal having a voltage level lower than the reference logic level when the slope of the power supply voltage curve has a negative characteristic.

10. The semiconductor device of claim 9, wherein the sensing signal generation section activates the slope sensing signal when the voltage level of the slope detection signal has a voltage level greater than the reference logic level, and deactivates the slope sensing signal when the voltage level of the slope detection signal has the voltage level lower than the reference logic level.

11. The semiconductor device of claim 7, wherein the reference pumping level is N times greater than the reference power supply level where N is an integer greater than two.

12. The semiconductor device of claim 7, wherein the power supply voltage detection unit activates the power supply voltage detection signal when the level of the power supply voltage is greater than the reference power supply level, and deactivates the power supply voltage detection signal when the level of the power supply voltage is lower than the reference power supply level.

13. The semiconductor device of claim 7, wherein the pumping voltage detection unit deactivates the pumping detection signal when the level of the pumping voltage is greater than the reference pumping level, and activates the pumping detection signal when the level of the pumping voltage is lower than the reference pumping level.

14. The semiconductor device of claim 8, wherein the oscillation control signal generation unit outputs the pumping detection signal as the oscillation control signal when at least one of the power supply voltage detection signal and the slope sensing signal is activated, and deactivates the oscillation control signal regardless of whether the pumping detection signal is activated or not, when both of the power supply voltage detection signal and the slope sensing signal are deactivated.

15. The semiconductor device of claim 7, wherein the oscillation signal generation unit generates the oscillation signal which oscillates at a given first frequency during an activation period of the oscillation control signal while oscillating at a given second frequency having a frequency lower than the first frequency during a deactivation period of the oscillation control signal.

16. The semiconductor device of claim 7, wherein the oscillation signal generation unit generates the oscillation signal which oscillates during an activation period of the oscillation control signal and does not oscillate during a deactivation period of the oscillation control signal.

17. A method for operating a semiconductor device, comprising:
performing a first charge pumping operation on a pumping voltage at each given first frequency when a power supply voltage has a level greater than a reference power supply level and the pumping voltage has a level lower than a reference pumping level;
performing a second charge pumping operation on the pumping voltage at each of the first frequency in response to a slope of a power supply voltage curve having a positive characteristic, when the power supply voltage has a level lower than the reference power supply level and the pumping voltage has the level lower than the reference pumping level; and
performing a third charge pumping operation on the pumping voltage at each given second frequency in response to the slope of the power supply voltage curve having zero or a negative characteristic, when the power supply voltage has the level lower than the reference power supply level and the pumping voltage has the level lower than the reference pumping level, wherein the second frequency has a frequency lower than the first frequency.

18. The method of claim 17, further comprising:
performing a fourth charge pumping operation on the pumping voltage at each of the second frequency regardless of the level of the power supply voltage, when the pumping voltage has a level greater than the reference pumping level.

19. The method of claim 17, wherein the second frequency has a frequency which is N times lower than the first frequency where N is an integer greater than two.

20. The method of claim 17, wherein the frequency of the second frequency is zero.

* * * * *